United States Patent
Min et al.

(10) Patent No.: US 9,412,308 B2
(45) Date of Patent: Aug. 9, 2016

(54) SAMPLE AND HOLD CIRCUIT AND SOURCE DRIVER INCLUDING THE SAME

(71) Applicant: SILICON WORKS CO., LTD., Daejeon-si (KR)

(72) Inventors: Kyung Jik Min, Seoul (KR); Hyun Kyu Jeon, Daejeon-si (KR); Yong Ik Jung, Incheon (KR); Hyun Ho Cho, Incheon-si (KR); Young Bok Kim, Daejeon-si (KR)

(73) Assignee: SILICON WORKS CO., LTD., Daejeon-Si (KR)

( * ) Notice: Subject to any disclaimer, the term of this patent is extended or adjusted under 35 U.S.C. 154(b) by 0 days.

(21) Appl. No.: 14/499,376

(22) Filed: Sep. 29, 2014

(65) Prior Publication Data
US 2015/0091618 A1    Apr. 2, 2015

(30) Foreign Application Priority Data
Sep. 30, 2013    (KR) .......................... 10-2013-0116393

(51) Int. Cl.
*G11C 27/02*    (2006.01)
*G09G 3/32*    (2016.01)

(52) U.S. Cl.
CPC ............ *G09G 3/3291* (2013.01); *G11C 27/026* (2013.01); *G09G 3/3233* (2013.01); *G09G 2300/0842* (2013.01); *G09G 2310/0294* (2013.01)

(58) Field of Classification Search
None
See application file for complete search history.

(56) References Cited

U.S. PATENT DOCUMENTS

| 6,222,175 B1 * | 4/2001 | Krymski .............. H04N 5/3575 250/208.1 |
| 6,795,117 B2 * | 9/2004 | Tay .................... H04N 1/32358 348/241 |
| 2012/0249237 A1 | 10/2012 | Garrity et al. |

FOREIGN PATENT DOCUMENTS

| JP | 5-182489 | 7/1993 |
| KR | 10-2006-0068090 | 6/2006 |
| KR | 10-2009-0099732 | 9/2009 |

* cited by examiner

*Primary Examiner* — Long Nguyen
(74) *Attorney, Agent, or Firm* — Kile Park Reed & Houtteman PLLC (57) ABSTRACT

A sample and hold circuit may include: a main sample and hold circuit configured to sample and hold pixel information of an organic light emitting diode (OLED) cell, and output a first output signal; and a dummy sample and hold circuit configured to sample and hold a reference voltage in synchronization with the main sample and hold circuit, and output a second output signal for offsetting a switching noise signal contained in the first output signal.

19 Claims, 4 Drawing Sheets

SAMPLE AND HOLD CIRCUIT AND SOURCE DRIVER INCLUDING THE SAME

BACKGROUND OF THE INVENTION

1. Field of the Invention

The present invention relates to a display device, and more particularly, to a sample and hold circuit and a source driver including the same.

2. Description of the Related Art

A sample and hold circuit refers to a circuit which samples a signal and holds the sampled signal until the sampled signal is processed. The sample and hold circuit may be represented by S/H.

When an analog-to-digital converter is used to quantize a signal, it is impossible to convert a wideband signal in case where a conversion time is not sufficiently short. Thus, the signal needs to be extended to the time required for processing the signal. Thus, an operation of converting continuous waveforms into discontinuous waveforms, that is, an operation of sampling a signal and holding the sampled signal for a predetermined time may be referred to as a sample and hold operation.

At this time, a switching noise signal may be introduced into the sample and hold circuit by switching operations of a plurality of switching elements formed in the sample and hold circuit. Such a switching noise signal may be contained in an output signal of the sample and hold circuit. The switching noise signal may cause an error while pixel information is detected.

SUMMARY OF THE INVENTION

Accordingly, the present invention has been made in an effort to solve the problems occurring in the related art, and an object of the present invention is to provide a sample and hold circuit capable of offsetting and eliminating noise which may be introduced while pixel information is sampled and held, and a source driver including the same.

In order to achieve the above object, according to one aspect of the present invention, a sample and hold circuit may include: a main sample and hold circuit configured to sample and hold pixel information of an organic light emitting diode (OLED) cell, and output a first output signal; and a dummy sample and hold circuit configured to sample and hold a reference voltage in synchronization with the main sample and hold circuit, and output a second output signal for offsetting a switching noise signal contained in the first output signal.

According to another aspect of the present invention, a sample and hold circuit may include: a main sample and hold circuit including: a first main switching element configured to transmit pixel information of an OLED cell; a main sampling capacitor configured to sample the pixel information transmitted from the first main switching element; a second main switching element configured to transmit the pixel information sampled by the main sampling capacitor; a main charge sharing unit configured to hold the sampled pixel information; and a third main switching element configured to output the pixel information held in the main charge sharing unit as a first output signal; a dummy sample and hold circuit including: a first dummy switching element configured to transmit a reference voltage; a dummy sampling capacitor configured to sample the reference voltage transmitted from the first dummy switching element; a second dummy switching element configured to transmit the reference voltage sampled by the dummy sampling capacitor; a dummy charge sharing unit configured to hold the sampled reference voltage; and a third dummy switching element configured to output the reference voltage held in the dummy charge sharing unit as a second output signal; and a common coupling unit configured to couple the main sampling capacitor and the dummy sampling capacitor and couple the main charge sharing unit and the dummy charge sharing unit.

According to another aspect of the present invention, a source driver may include: a sample and hold circuit including: a main sample and hold circuit configured to sample and hold pixel information of an OLED cell and output a first output signal; and a dummy sample and hold circuit configured to sample and hold a reference voltage in synchronization with the main sample and hold circuit and output a second output signal for offsetting a switching noise signal contained in the first output signal; and an amplifier configured to receive the first and second output signals, and differentially amplify the first and second output signals so as to offset the switching noise signal contained in the first output signal.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Reference will now be made in greater detail to a preferred embodiment of the invention, an example of which is illustrated in the accompanying drawings. Wherever possible, the same reference numerals will be used throughout the drawings and the description to refer to the same or like parts.

Figure 1:
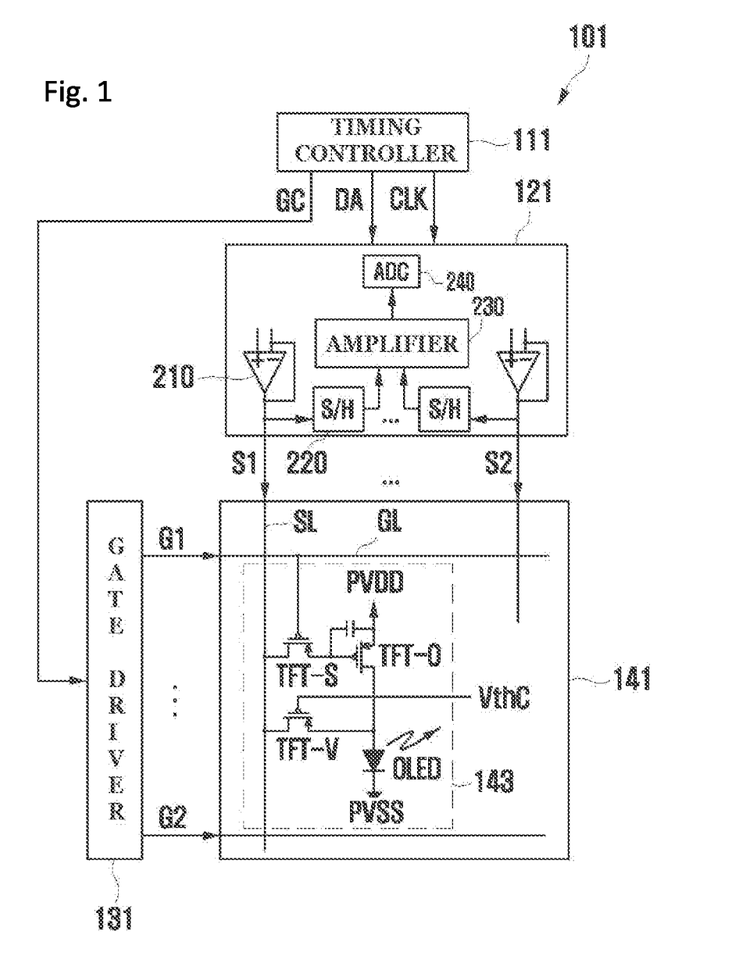
FIG. 1 is a block diagram of a display device to which an embodiment of the present invention is applied.

FIG. 1 is a block diagram of a display device 101 to which an embodiment of the present invention is applied. Referring to FIG. 1, the display device 101 may include a timing controller 111, a source driver 121, a gate driver 131, and a display panel 141.

The timing controller 111 may transmit image data DA and a clock signal CLK to the source driver 121, and transmit a gate control signal GC to the gate driver 131.

The source driver 121 may receive the clock signal CLK and the image data DA from the timing controller 111, process the image data DA in synchronization with the clock signal CLK, and output source driving signals S1 and S2 to the display panel 141 to drive data lines SL formed in the display panel 141. FIG. 1 illustrates one source driver 121, but the display device 101 may include a plurality of source drivers 121 in consideration of the size and resolution of the display panel 141.

Figure 2:
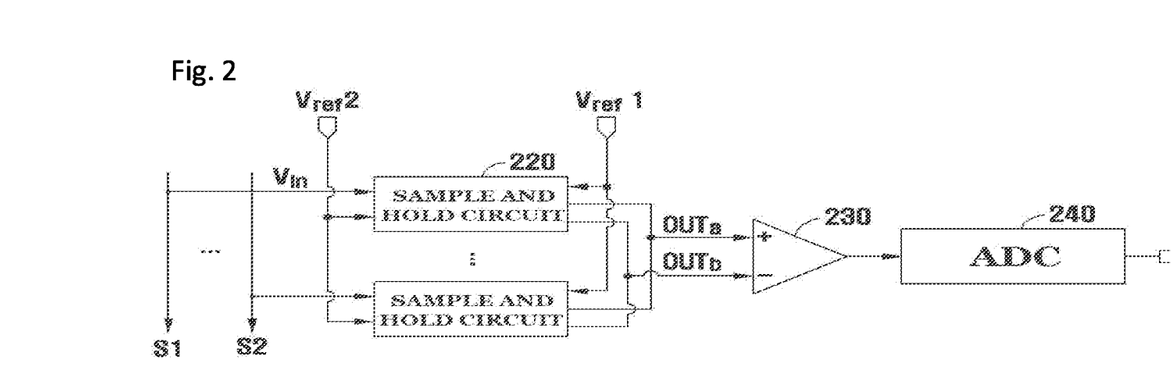
FIG. 2 is a schematic block diagram of a source driver illustrated in FIG. 1.

The source driver 121 may include output buffers 210, sample and hold circuits 220, an amplifier 230, and an analog-to-digital converter 240. The output buffers 210 may output the source driving signals S1 and S2, respectively. The sample and hold circuits 220 may detect pixel information transmitted from the display panel 141. The amplifier 230 may amplify output signals of the sample and hold circuits 220. The analog-to-digital converter 240 may convert the output signals of the amplifier 230 into digital signals. Although not illustrated, the source driver 121 may further include a shift register (not illustrated), a latch (not illustrated), and a digital-to-analog converter (not illustrated), in order to process the image data DA in synchronization with the clock signal CLK. The signals processed through the digital-to-analog converter may be outputted as the source driving signals S1 and S2 through the output buffers 210, respectively.

The output signals of the analog-to-digital converter 240 may be provided to the timing controller 111, and the timing controller 111 may perform a control operation reflecting the pixel information by referring to the output signals of the analog-to-digital converter 240.

The amplifier 230 may amplify the output signals of the sample and hold circuits 220, in order to guarantee a high-speed operation of the analog-to-digital converter 240.

The sample and hold circuit 220 may recognize pixel information of an OLED cell 143, transmitted through a data line SL of the display panel 141. The pixel information may include a turn-on voltage of an organic light emitting diode (OLED), a threshold voltage Vth of a thin film transistor (TFT), a current characteristic of the TFT, and a mobility characteristic of the TFT. Among the characteristics, the current characteristic of the TFT may be sensed through a voltage.

The gate driver 131 may receive a gate control signal GC outputted from the timing controller 111, generate gate driving signals G1 and G2 using the gate control signal GC, and output the gate driving signals G1 and G2 to drive the scan lines GL formed in the display panel 141. FIG. 1 illustrates one gate driver 131, but the display device may include a plurality of gate drivers 131 in consideration of the size and resolution of the display panel 141.

The display panel 141 may receive the source driving signals S1 and S2 and the gate driving signals G1 and G2 from the source driver 121 and the gate driver 131, respectively, and display an image. In the present embodiment, the display panel 141 may include pixels implemented by using OLED cells 143. The OLED cell 143 may receive a source driving signal of a data line SL and a gate driving signal of a scan line GL, and display an image in response to an operation of the OLED.

The operation of the OLED cell 143 may be described in detail as follows. According to the gate driving signal G1 supplied to the scan line GL, a switching thin film transistor TSF-S of the data line SL may be turned on. Then, the source driving signal S1 supplied through the data line SL may be supplied to the gate of a driving thin film transistor TFT-O through the switching thin film transistor TFT-S. The driving thin film transistor TFT-O may be turned on by the source driving signal S1 transmitted through the switching thin film transistor TFT-S, and apply voltages PVDD and PVSS to the organic light emitting diode OLED. As a driving current is supplied at brightness corresponding to the source driving signal S1, the OLED may emit light.

Since the OLED gradually deteriorates with time, the threshold voltage Vth thereof may be changed. Then, due to the change of the threshold voltage Vth, the brightness of the OLED may gradually decrease in response to the same driving current. The change in threshold voltage Vth of the OLED may be detected through a threshold-voltage-detection thin film transistor TFT-V. At this time, a threshold-voltage-detection control signal VthC for detecting the change in threshold voltage Vth of the OLED may be provided to the threshold-voltage-detection thin film transistor TFT-V in a standby state or before an image is displayed. The above-described change of the threshold voltage Vth may correspond to an example of pixel information. The pixel information such as the threshold voltage Vth of the OLED may be provided to the sample and hold circuit 220 through the turned-on threshold-voltage-detection thin film transistor TFT-V and the data line SL.

FIG. 2 illustrates a path through which pixel information is transmitted in the source driver 121. In FIG. 2, the pixel information is represented by $V_{IN}$. The pixel information $V_{IN}$ of each OLED cell 143 may be provided to the sample and hold circuit 220. The sample and hold circuit 220 may be configured to provide a signal obtained by sampling and holding the pixel information $V_{IN}$ and a reference signal Vref2 to the amplifier 230.

The sample and hold circuit 220 may receive the pixel information $V_{IN}$ of the OLED cell 143 of the display panel 141, and detect whether the pixel characteristic of the display panel 141 is changed. The source driver 121 may include a plurality of sample and hold circuits 220 corresponding to the number of data lines of the display panel 141. Output signals of the sample and hold circuits 220 may be commonly applied to the amplifier 230.

Referring to FIG. 2, the source driver 121 may include a plurality of sample and hold circuits 220, the amplifier 230, and the analog-to-digital converter 240.

The sample and hold circuit 220 may receive the pixel information $V_{IN}$ of the OLED cell 143 of the display panel 141, and detect whether the pixel characteristic of the display panel 141 is changed. The number of sample and hold circuits 220 may correspond to the number of data lines of the display panel 141. The output signals of the sample and hold circuits 220 may be commonly applied to the amplifier 230.

More specifically, the sample and hold circuit 220 may receive the pixel information $V_{IN}$ and reference voltages Vref1 and Vref2, and provide output signals OUTa and OUTb.

The amplifier 230 may receive the output signals OUTa and OUTb of the sample and hold circuits 220, and differentially amplify the output signals OUTa and OUTb.

The analog-to-digital converter 240 may be configured to convert analog signals outputted from the amplifier 230 into digital signals, and provide the digital signals to the timing controller 111. The timing controller 111 may perform control based on the pixel characteristic, by referring to the output signals of the analog-to-digital converter 240.

Figure 3:
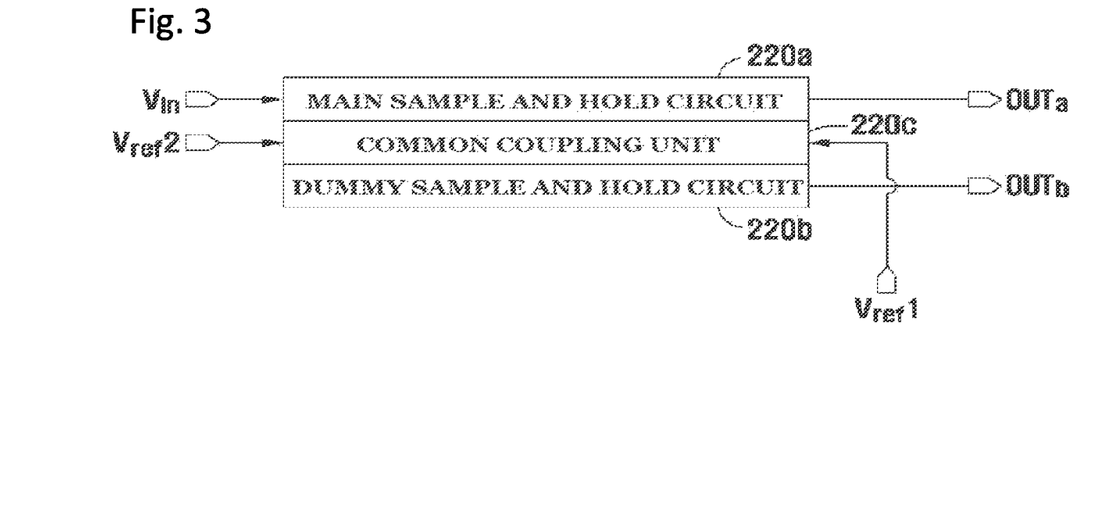
FIG. 3 is a block diagram of a sample and hold circuit illustrated in FIG. 2.

FIG. 3 is a block diagram of the sample and hold circuit 220 illustrated in FIG. 2. Referring to FIG. 3, the sample and hold circuit 220 may include a main sample and hold circuit 220a, a common coupling unit 220c, and a dummy sample and hold circuit 220b.

The main sample and hold circuit 220a may sample and hold the pixel information $V_{IN}$ of the OLED cell 143 of the display panel 141. While the pixel information $V_{IN}$ is sampled and held in the main sample and hold circuit 220a, switching noise signals may be introduced by the plurality of switching elements MSW1 to MSW4 of FIG. 4, which are formed in the main sample and hold circuit 220a. Thus, the switching noise signals may be contained in the output signal OUTa of the main sample and hold circuit 220a.

The common coupling unit 220c may be positioned between the main sample and hold circuit 220a and the dummy sample and hold circuit 220b, and commonly coupled to the main sample and hold circuit 220a and the dummy sample and hold circuit 220b. The common coupling unit 220c receiving the first and second reference voltages Vref1 and Vref2 will be described in detail with reference to FIG. 4.

The dummy sample and hold circuit 220*b* may sample and hold the reference voltage Vref2. While the reference voltage Vref2 is sampled and held in the dummy sample and hold circuit 220*b*, switching noise signals may be introduced by a plurality of switching elements DSW1 to DSW4 of FIG. 4, which are formed in the dummy sample and hold circuit 220*b*. Thus, switching noise signals may be contained in the output signal OUTb of the dummy sample and hold circuit 220*b*. The reference voltage Vref1 may be used for resetting, and the reference voltage Vref2 may be used for sampling and holding the pixel information $V_{IN}$. The reference voltages Vref1 and Vref2 may be set to have a lower level than the pixel information $V_{IN}$. For example, the reference voltage Vref2 may be set to a ground voltage, and the reference voltage Vref1 may be set to a voltage having a higher level than the ground voltage and a lower level than the pixel information.

The dummy sample and hold circuit 220*b* may have the same circuit structure as the main sample and hold circuit 220*a*. Furthermore, the switching elements DSW1 to DSW4 of the dummy sample and hold circuit 220*b* may be driven in synchronization with the switching elements MSW1 to MSW4 of the main sample and hold circuit 220*a*.

Thus, the switching noise signal generated in the dummy sample and hold circuit 220*b* may have the same level as or a similar level to the switching noise signal generated in the main sample and hold circuit 220*a*.

The amplifier 230 of FIG. 2 may include a non-inverting input terminal (+) and an inverting input terminal (−), receive the output signal OUTa of the main sample and hold circuit 220*a* through the non-inverting input terminal (+), and receive the output signal OUTb of the dummy sample and hold circuit 220*b* through the inverting input terminal (−). Thus, the output signal OUTa of the main sample and hold circuit 220*a* may be attenuated by the output signal OUTb of the dummy sample and hold circuit 220*b*. That is, the switching noise signal contained in the output signal OUTa of the main sample and hold circuit 220*a* may be offset and reduced or eliminated by the switching noise signal of the output signal OUTb outputted from the dummy sample and hold circuit 220*b*. Thus, the signal outputted from the amplifier 230 of FIG. 2 may not contain the switching noise signal generated in the sample and hold circuit 220. The amplifier 230 of FIG. 2 may be implemented with an operational amplifier having differential input terminals.

As described above, the sample and hold circuit 220 in accordance with the embodiment of the present invention may include the dummy sample and hold circuit 220*b* having the same structure as the main sample and hold circuit 220*a* which samples and holds the pixel information $V_{IN}$ transmitted from the display panel 141, in order to eliminate the switching noise signals generated in the main sample and hold circuit 220*a*. Therefore, the output signal of the amplifier 230 may be stably outputted as a stable signal containing no noise.

Figure 4:
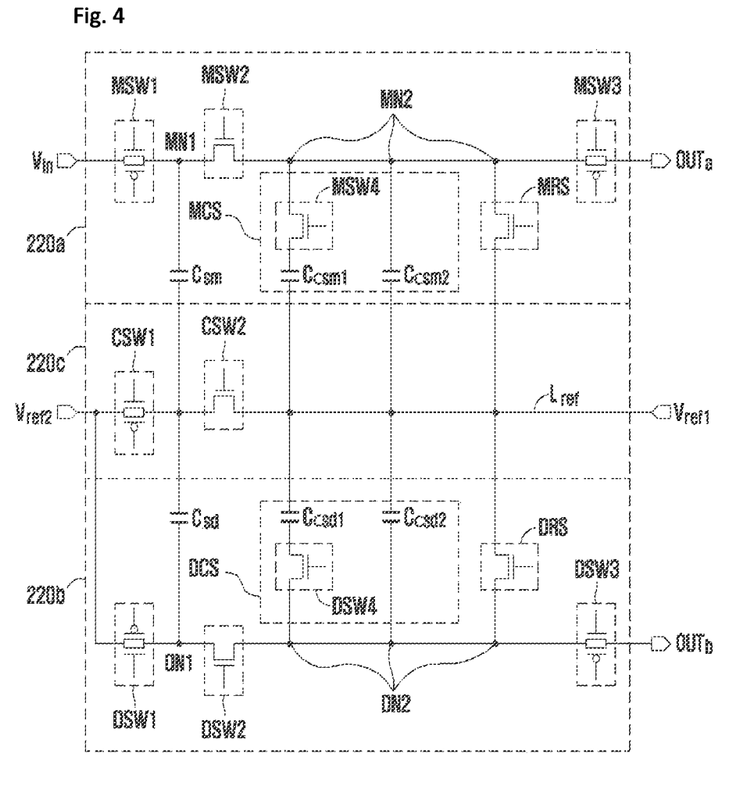
FIG. 4 is a circuit diagram of the sample and hold circuit illustrated in FIG. 2.

FIG. 4 is a circuit diagram of the sample and hold circuit 220 illustrated in FIG. 2, and a detailed circuit diagram of FIG. 3.

The main sample and hold circuit 220*a* may include first to third main switching elements MSW1 to MSW3, a main sampling capacitor Csm, a main charge sharing unit MCS, and a main reset unit MRS.

The first and third main switching elements MSW1 and MSW3 may include transmission gates, and the second main switching element MSW2 may include a MOS (metal oxide semiconductor) transistor.

The main sampling capacitor Csm may be coupled between the common coupling unit 220*c* and a coupling node MN1 for the first and second switching elements MSW1 and MSW2. The main sampling capacitor Csm may sample the pixel information $V_{IN}$ outputted from the first main switching element MSW1 when the first main switching element MSW1 is turned on. When the first main switching element MSW1 for transmitting the pixel information $V_{IN}$ is turned on or off, a switching noise signal may be introduced from the first switching element MSW1. The switching noise signal and the pixel information $V_{IN}$ may be sampled together in the main sampling capacitor Csm.

The main charge sharing unit MCS may be coupled between the common coupling unit 220*c* and a coupling node MN2 for the second and third main switching elements MSW2 and MSW3. The main charge sharing unit MCS may share the voltage sampled in the main sampling capacitor Csm. When the second main switching element MSW2 is turned on, electric charges sampled in the main sampling capacitor Csm may be shared by the main charge sharing unit MCS through the second main switching element MSW2. Thus, the voltage of the main sampling capacitor Csm may decrease. The main charge sharing unit MCS may include a fourth main switching element MSW4, a first main charge sharing capacitor Ccsm1, and a second main charge sharing capacitor Ccsm2.

The fourth main switching element MSW4 may be coupled between the first main charge sharing capacitor Ccsm1 and a coupling node MN2 for the second and third main switching elements MSW2 and MSW3.

The first main charge sharing capacitor Ccsm1 may be coupled between the fourth main switching element MSW4 and the common coupling unit 220*c*. The first main charge sharing capacitor Ccsm1 may share the voltage sampled in the main sampling capacitor Csm. That is, when the second and fourth main switching elements MSW2 and MSW4 are turned on, the electric charges sampled in the main sampling capacitor Csm may be shared by the first main charge sharing capacitor Ccsm1 through the second and fourth main switching elements MSW2 and MSW4. Thus, the voltage of the main sampling capacitor Csm may decrease. At this time, while the second and fourth main switching element MSW2 and MSW4 are turned on or off, switching noise signals may be introduced from the second and fourth main switching elements MSW2 and MSW4. The switching noise signals and the pixel information $V_{IN}$ may be sampled together in the first main charge sharing capacitor Ccsm1.

The second main charge sharing capacitor Ccsm2 may be coupled between the common coupling unit 220*c* and the coupling node MN2 for the second and third switching elements MSW2 and MSW3. The second main charge sharing capacitor Ccsm2 may share the voltage sampled in the main sampling capacitor Csm. That is, when the second main switching element MSW2 is turned on, the electric charges sampled in the main sampling capacitor Csm may be shared by the second main charge sharing capacitor Ccsm2 through the second main switching element MSW2. Thus, the voltage of the main sampling capacitor Csm may decrease. At this time, while the second main switching element MSW2 is turned on or off, a switching noise signal may be introduced from the second main switching element MSW2. The switching noise signal may be sampled in the second main charge sharing capacitor Ccsm2.

According to the number of first and second main charge sharing capacitors Ccsm1 and Ccsm2 formed in the main charge sharing unit MCS, the voltage sharing ratio of the main sampling capacitor Csm may differ. For example, when the main sampling capacitor Csm has the same capacity as the first and second main charge sharing capacitors Ccsm1 and Ccsm2, the voltage of the main sampling capacitor Csm may decrease to the half in case where only one of the first and second main charge sharing capacitors Ccsm1 and Ccsm2 is included in the main charge sharing unit MCS, and decrease to ⅓ in case where both of the first and second main charge sharing capacitors Ccsm1 and Ccsm2 are included in the main charge sharing unit MCS. Thus, when a sensing voltage range for the pixel information $V_{IN}$ inputted to the sample and hold circuit 220 is wide, the number of main charge sharing capacitor may be properly adjusted.

That is, the main charge sharing unit MCS of FIG. 4 may include one or more first main charge sharing capacitors Ccsm1. At this time, a switching element coupled to the first main charge sharing capacitor Ccsm1 may be turned on or off to adjust the voltage sharing ratio of the main sampling capacitor Csm.

The main reset unit MRS may be coupled between the common coupling unit 220c and the coupling node MN2 for the second and third main switching elements MSW2 and MSW3, and reset the first and second main charge sharing capacitors Ccsm1 and Ccsm2. The main reset unit MRS may include a MOS transistor. Thus, when the MOS transistor forming the main reset unit MRS is turned on, both of the first and second main charge sharing capacitors Ccsm1 and Ccsm2 may be discharged to the level of the reference voltage Vref1 applied to the common coupling unit 220c.

The third main switching element MSW3 may be coupled to the output terminal of the sample and hold circuit 220. Thus, when the third main switching element MSW3 is turned on, the voltage sampled in the main sampling capacitor Csm may be outputted from the sample and hold circuit 220 and transmitted to the amplifier 230 of FIG. 2.

The dummy sample and hold circuit 220b may have the same circuit structure as the main sample and hold circuit 220a. Furthermore, the switching elements DSW1 to DSW4 of the dummy sample and hold circuit 220b may be driven in synchronization with the switching elements MSW1 to MSW4 of the main sample and hold circuit 220a. Thus, the switching noise signal generated in the dummy sample and hold circuit 220b may have the same level as or a similar level to the switching noise signal generated in the main sample and hold circuit 220a.

The dummy sample and hold circuit 220b may include first to third dummy switching elements DSW1 to DSW3, a dummy sampling capacitor Csd, a dummy charge sharing unit DCS, and a dummy reset unit DRS.

The first and third dummy switching elements DSW1 and DSW3 may include transmission gates, and the second dummy switching element DSW2 may include a MOS transistor.

The dummy sampling capacitor Csd may be coupled between the common coupling unit 220c and a coupling node DN1 for the first and second dummy switching elements DSW1 and DSW2. The dummy sampling capacitor Csd may sample the voltage generated from the first dummy switching element DSW1 when the first dummy switching element DSW1 is turned on or off. That is, when the first dummy switching element DSW1 is turned on or off, a switching noise signal may be generated from the first dummy switching element DSW1, and sampled in the dummy sampling capacitor Csd. As the reference voltages Vref1 and Vref2 are applied to both ends of the dummy sampling capacitor Csd, the switching noise signal generated from the first dummy switching element DSW1 may be sampled in the dummy sampling capacitor Csd.

The dummy charge sharing unit DCS may be coupled between the common coupling unit 220c and a coupling node DN2 for the second and third dummy switching elements DSW2 and DSW3. The dummy charge sharing unit DCS may receive the voltage outputted from the second dummy switching element DSW2 and sample the received voltage, when the second dummy switching element DSW2 is turned on or off. That is, when the second dummy switching element DSW2 is turned on or off, a switching noise signal may be generated from the second dummy switching element DSW2, and sampled in the dummy charge sharing unit DCS. As the reference voltages Vref1 and Vref2 are applied to both ends of the dummy charge sharing unit DCS, the switching noise signal generated from the second dummy switching element DSW2 may be sampled in the dummy charge sharing unit DCS. The dummy charge sharing unit DCS may include a fourth dummy switching element DSW4, a first dummy charge sharing capacitor Ccsd1, and a second dummy charge sharing capacitor Ccsd2.

The fourth dummy switching element DSW4 may be coupled between the first dummy charge sharing capacitor Ccsd1 and the coupling node DN2 for the second and third dummy switching elements DSW2 and DSW3, and include a MOS transistor.

The first dummy charge sharing capacitor Ccsd1 may be coupled between the fourth dummy switching element DSW4 and the common coupling unit 220c. The first dummy charge sharing capacitor Ccsd1 may sample switching noise signals generated from the second and fourth dummy switching elements DSW2 and DSW4. That is, while the second and fourth dummy switching elements DSW2 and DSW4 are turned on or off, switching noise signals may be generated from the second and fourth dummy switching elements DSW2 and DSW4, and sampled in the first dummy charge sharing capacitor Ccsd1.

The second dummy charge sharing capacitor Ccsd2 may be coupled between the common coupling unit 220c and the coupling node DN2 for the second and third switching elements DSW2 and DSW3. The second dummy charge sharing capacitor Ccsd2 may sample a switching noise signal generated from the second dummy switching element DSW2. That is, while the second dummy switching element DSW2 is turned on or off, a switching noise signal may be generated from the second dummy switching element DSW2, and sampled in the second dummy charge sharing capacitor Ccsd2.

The number of dummy charge sharing capacitors Ccsd1 and Ccsd2 formed in the dummy charge sharing unit DCS may be set to be equal to the number of main charge sharing capacitors Ccsm1 and Ccms2 formed in the main charge sharing unit MCS.

The dummy reset unit DCS may be coupled between the common coupling unit 220c and the coupling node DN2 for the second and third dummy switching elements DSW2 and DSW3, and reset the first and second dummy charge sharing capacitors Ccsd1 and Ccsd2. The dummy reset unit DRS may include a MOS transistor. Thus, when the MOS transistor forming the dummy reset unit DRS is turned on, both of the first and second dummy charge sharing capacitors Ccsd1 and Ccsd2 may be discharged to the level of the reference voltage Vref1 applied to the common coupling unit 220c.

The third dummy switching element DSW3 may be coupled to the output terminal of the sample and hold circuit 220. Thus, when the third dummy switching element DSW3 is turned on, the voltage sampled in the dummy sampling capacitor Csd may be outputted from the sample and hold circuit 220 and transmitted to the amplifier 230 of FIG. 2.

The common coupling unit 220c may be formed between the main sample and hold circuit 220a and the dummy sample and hold circuit 220b, and couple the main sample and hold circuit 220a and the dummy sample and hold circuit 220b to each other. The common coupling unit 220c may include a first common switching element CSW1, a second common switching element CSW2, and a reference line Lref. The first and second common switching elements CSW1 and CSW2 of the common coupling unit 220c may be driven in synchronization with the first and second main switching elements MSW1 and MSW2 of the main sample and hold circuit 220a and the first and second dummy switching elements DSW1 and DSW2 of the dummy sample and hold circuit 220b.

The first switching element CSW1 may include a transmission gate, and the second switching element CSW2 may include a MOS transistor.

Both of the first and second common switching elements CSW1 and CSW2 may be coupled to the reference line Lref, and the main sample and hold circuit 220a and the dummy sample and hold circuit 220b may be commonly coupled to the reference line Lref.

The second reference voltage Vref2 may be applied to the first common switching element CSW1, and the first reference voltage Vref1 may be applied to the second common switching element CSW2. Thus, the first and second common switching elements CSW1 and CSW2 may not be turned on at the same time. That is, when the first common switching element CSW1 is turned on, the second common switching element CSW2 may be turned off. On the other hand, when the second common switching element CSW2 is turned on, the first common switching element CSW1 may be turned off.

The reference voltage Vref1 may be used for resetting, and the reference voltage Vref2 may be used for sampling and holding the pixel information $V_{IN}$. The reference voltages Vref1 and Vref2 may be set to have a lower level than the pixel information $V_{IN}$. For example, the reference voltage Vref2 may be set to the ground voltage, and the reference voltage Vref1 may be set to a voltage having a high level than the ground voltage and a lower level than the pixel information.

In accordance with the embodiments of the present invention, the sample and hold circuit may include the main sample and hold circuit configured to sample and hold pixel information and the dummy sample and hold circuit having the same structure as the main sample and hold circuit. The dummy sample and hold circuit may generate a signal for offsetting a switching noise signal introduced during the sampling and holding process of the main sample and hold circuit.

The source driver including the dummy sample and hold circuit to drive the display panel may precisely process signals transmitted from the plurality of pixels formed in the display panel.

Thus, the source driver including the dummy sample and hold circuit may precisely detect the characteristic information of the pixels formed in the display panel.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A sample and hold circuit comprising:
    a main sample and hold circuit configured to sample and hold pixel information of an organic light emitting diode (OLED) cell, and output a first output signal; and
    a dummy sample and hold circuit configured to sample and hold a reference voltage in synchronization with the main sample and hold circuit, and output a second output signal for offsetting a switching noise signal contained in the first output signal,
    wherein the main sample and hold circuit comprises:
        a main sampling capacitor configured to sample the pixel information; and
        a main charge sharing unit configured to hold the sampled pixel information sampled by the main sampling capacitor.

2. The sample and hold circuit of claim 1, wherein each of the main sample and hold circuit and the dummy sample and hold circuit comprises a plurality of switching elements and a plurality of sampling capacitors coupled in parallel to each other, and wherein the main sample and hold circuit and the dummy sample and hold circuit have a same structure.

3. The sample and hold circuit of claim 1, wherein the main sample and hold circuit further comprises:
    a first main switching element configured to transmit the pixel information;
    the main sampling capacitor configured to sample the pixel information transmitted from the first main switching element;
    a second main switching element configured to transmit the pixel information sampled by the main sampling capacitor;
    the main charge sharing unit configured to hold the pixel information transmitted from the second main switching element; and
    a third main switching element configured to output the pixel information held in the main charge sharing unit as the first output signal.

4. The sample and hold circuit of claim 3, wherein the dummy sample and hold circuit comprises:
    a first dummy switching element configured to transmit the reference voltage;
    a dummy sampling capacitor configured to sample the reference voltage transmitted from the first dummy switching element;
    a second dummy switching element configured to transmit the reference voltage sampled by the dummy sampling capacitor;
    a dummy charge sharing unit configured to hold the sampled reference voltage; and
    a third dummy switching element configured to output the reference voltage held in the dummy charge sharing unit as the second output signal.

5. The sample and hold circuit of claim 4, wherein the first dummy switching element, the second dummy switching element, and the third dummy switching element are driven in synchronization with the first main switching element, the second main switching element, and the third main switching element.

6. The sample and hold circuit of claim 1, wherein the reference voltage is set to a ground voltage.

7. The sample and hold circuit of claim 1, wherein the second output signal has a same magnitude as a magnitude of the switching noise signal.

8. A sample and hold circuit comprising:
    a main sample and hold circuit comprising: a first main switching element configured to transmit pixel information of an OLED cell; a main sampling capacitor configured to sample the pixel information transmitted from the first main switching element; a second main switching element configured to transmit the pixel information sampled by the main sampling capacitor; a main charge sharing unit configured to hold the sampled pixel information; and a third main switching element configured to output the pixel information held in the main charge
sharing unit as a first output signal;
a dummy sample and hold circuit comprising: a first
dummy switching element configured to transmit a reference voltage; a dummy sampling capacitor configured
to sample the reference voltage transmitted from the first
dummy switching element; a second dummy switching
element configured to transmit the reference voltage
sampled by the dummy sampling capacitor; a dummy
charge sharing unit configured to hold the sampled reference voltage; and a third dummy switching element
configured to output the reference voltage held in the
dummy charge sharing unit as a second output signal;
and
a common coupling unit configured to couple the main
sampling capacitor and the dummy sampling capacitor
and couple the main charge sharing unit and the dummy
charge sharing unit.

9. The sample and hold circuit of claim 8, wherein the first dummy switching element, the second dummy switching element, and the third dummy switching element are driven in synchronization with the first main switching element, the second main switching element, and the third main switching element.

10. The sample and hold circuit of claim 8, wherein the first output signal contains a first switching noise signal generated by the first main switching element, the second main switching element, and the third main switching element, and
the second output signal contains a second switching noise signal generated by the first dummy switching element, the second dummy switching element, and the third dummy switching element, and has a same magnitude as a magnitude of the first switching noise signal.

11. The sample and hold circuit of claim 8, wherein the main sample and hold circuit further comprises a main reset unit coupled in parallel to the main charge sharing unit and configured to reset the main charge sharing unit, and
the dummy sample and hold circuit comprises a dummy reset unit coupled in parallel to the dummy charge sharing unit and configured to reset the dummy charge sharing unit.

12. The sample and hold circuit of claim 8, wherein each of the main charge sharing unit and the dummy charge sharing unit comprises a plurality of capacitors.

13. The sample and hold circuit of claim 8, wherein the common coupling unit comprises:
a reference line having one end configured to receive a second reference voltage equal to the reference voltage and the other end configured to receive a first reference voltage;
a first common switching element configured to perform a switching operation in synchronization with the first main switching element and the first dummy switching element, and transmit the second reference voltage to a first node on the reference line which couples the main sampling capacitor and the dummy sampling capacitor; and
a second common switching element configured to perform a switching operation in synchronization with the second main switching element and the second dummy switching element, and transmit the second reference voltage to a second node on the reference line which couples the main charge sharing unit and the dummy charge sharing unit.

14. The sample and hold circuit of claim 13, wherein the second reference voltage is set to a ground voltage, and the first reference voltage is set to a voltage having a higher level than the second reference voltage and a lower level than the pixel information.

15. A source driver comprising:
a sample and hold circuit comprising: a main sample and hold circuit configured to sample and hold pixel information of an OLED cell and output a first output signal; and a dummy sample and hold circuit configured to sample and hold a reference voltage in synchronization with the main sample and hold circuit and output a second output signal for offsetting a switching noise signal contained in the first output signal; and
an amplifier configured to receive the first and second output signals, and differentially amplify the first and second output signals so as to offset the switching noise signal contained in the first output signal,
wherein the main sample and hold circuit comprises:
a main sampling capacitor configured to sample the pixel information; and
a main charge sharing unit configured to hold the sampled pixel information sampled by the main sampling capacitor.

16. The source driver of claim 15, wherein the sample and hold circuit comprises:
the main sample and hold circuit further comprising:
a first main switching element configured to transmit the pixel information of the OLED cell;
the main sampling capacitor configured to sample the pixel information transmitted from the first main switching element;
a second main switching element configured to transmit the pixel information sampled by the main sampling capacitor;
the main charge sharing unit configured to hold the pixel information sampled through main charge sharing capacitors and a fourth main switching element; and
a third main switching element configured to output the pixel information held in the main charge sharing unit as a first output signal;
the dummy sample and hold circuit comprising:
a first dummy switching element configured to transmit a reference voltage;
a dummy sampling capacitor configured to sample the reference voltage transmitted from the first dummy switching element;
a second dummy switching element configured to transmit the reference voltage sampled by the dummy sampling capacitor;
a dummy charge sharing unit configured to hold the reference voltage sampled through dummy charge sharing capacitors and a fourth dummy switching element; and
a third dummy switching element configured to output the reference voltage held in the dummy charge sharing unit as a second output signal; and
a common coupling unit configured to couple the main sampling capacitor and the dummy sampling capacitor and couple the main charge sharing unit and the dummy charge sharing unit.

17. The source driver of claim 16, wherein the first output signal contains a first switching noise signal generated in one or more of the first main switching element, the second main switching element, the third main switching element, and the fourth main switching element,
the second output signal contains a second switching noise signal generated in one or more of the first dummy switching element, the second dummy switching element, the third dummy switching element, and the fourth dummy switching element, and the amplifier offsets the first switching noise signal contained in the first output signal with the second switching noise signal contained in the second output signal.

18. The source driver of claim 15, wherein the source driver comprises a plurality of sample and hold circuits.

19. The source driver of claim 16, wherein the common coupling unit comprises:

a reference line having one end configured to receive a second reference voltage equal to the reference voltage and the other end configured to receive a first reference voltage;

a first common switching element configured to perform a switching operation in synchronization with the first main switching element and the first dummy switching element, and transmit the second reference voltage to a first node on the reference line which couples the main sampling capacitor and the dummy sampling capacitor; and a second common switching element configured to perform a switching operation in synchronization with the second main switching element and the second dummy switching element, and transmit the second reference voltage to a second node on the reference line which couples the main charge sharing unit and the dummy charge sharing unit.

* * * * *